United States Patent
Lee et al.

(10) Patent No.: US 9,355,703 B2
(45) Date of Patent: May 31, 2016

(54) DEVICES, SYSTEMS AND METHODS WITH IMPROVED REFRESH ADDRESS GENERATION

(71) Applicant: Samsung Electronics Co., Ltd.

(72) Inventors: Woo-Jin Lee, Seoul (KR); Dae-Hyun Kim, Hwaseong-si (KR); Sang-Yun Kim, Hwaseong-si (KR); Jae-Sung Kim, Suwon-si (KR); Young-Soo Sohn, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 263 days.

(21) Appl. No.: 14/077,187

(22) Filed: Nov. 11, 2013

(65) Prior Publication Data

US 2014/0241093 A1     Aug. 28, 2014

(30) Foreign Application Priority Data

Feb. 25, 2013   (KR) .......................... 10-2013-0020008

(51) Int. Cl.
| | |
|---|---|
| *G11C 7/00* | (2006.01) |
| *G11C 11/406* | (2006.01) |
| *G11C 29/02* | (2006.01) |
| *G11C 29/50* | (2006.01) |

(52) U.S. Cl.
CPC .... *G11C 11/40611* (2013.01); *G11C 11/40622* (2013.01); *G11C 29/028* (2013.01); *G11C 29/50016* (2013.01)

(58) Field of Classification Search
CPC ................. G11C 11/40611; G11C 11/40622; G11C 29/028; G11C 29/50016

USPC ................................ 365/222, 52, 230.06, 236
See application file for complete search history.

(56) References Cited

U.S. PATENT DOCUMENTS

| | | | |
|---|---|---|---|
| 5,644,545 A | 7/1997 | Fisch | |
| 7,565,479 B2 | 7/2009 | Best et al. | |
| 2005/0099868 A1 | 5/2005 | Oh | |
| 2007/0033339 A1* | 2/2007 | Best ..................... | G11C 11/406 711/106 |
| 2010/0208537 A1 | 8/2010 | Pelley, III et al. | |
| 2013/0279283 A1* | 10/2013 | Seo .................. | G11C 11/40611 365/222 |
| 2013/0279284 A1* | 10/2013 | Jeong ................... | G11C 11/402 365/222 |

FOREIGN PATENT DOCUMENTS

| | | |
|---|---|---|
| JP | 2007-0172832 | 7/2007 |
| KR | 10-644221 | 11/2006 |
| KR | 10-810060 | 10/2007 |
| KR | 2009-0031128 | 3/2009 |
| KR | 2010-0065446 | 6/2010 |

\* cited by examiner

*Primary Examiner* — Toan Le
(74) *Attorney, Agent, or Firm* — Muir Patent Law, PLLC

(57) ABSTRACT

A refresh address generator may include a lookup table including a first portion storing a first group of addresses associated with a first data retention time, and a second portion storing a second group of addresses associated with a second data retention time different from the first data retention time, wherein the addresses of the first portion are more frequently accessed than the addresses of the second portion to refresh the memory cells corresponding to the addresses. Systems and methods may also implement such refresh address generation.

23 Claims, 12 Drawing Sheets

FIG. 8

| | 1~2ms | 2~4ms | 4~8ms | 8~16ms | 16~32ms | 32~64ms | 64~128ms |
|---|---|---|---|---|---|---|---|
| # of weak cell row | A | B | C | D | E | F | G |

DEVICES, SYSTEMS AND METHODS WITH IMPROVED REFRESH ADDRESS GENERATION

CROSS-REFERENCE TO RELATED APPLICATION

This application claims priority from Korean Patent Application No. 10-2013-0020008 filed on Feb. 25, 2013 in the Korean Intellectual Property Office, and all the benefits accruing therefrom under 35 U.S.C. 119, the contents of which are herein incorporated by reference in its entirety.

BACKGROUND

1. Field of the Invention

The present invention relates to refresh address generation.

2. Description of the Related Art

For data retention, a volatile memory device necessarily performs a refresh operation. As volatile memory devices are getting smaller, refresh characteristics of some memory cells were noticeably degraded.

SUMMARY

The present disclosure provides a refresh address generator, which can minimize a size of a lookup table that stores addresses of weak cells.

The above and other objects of the present invention will be described in or be apparent from the following description of the preferred embodiments.

According to some embodiments, a device comprises a refresh address generator circuit to generate refresh addresses to activate a refresh of memory cells corresponding to the generated refresh addresses, the refresh address generator circuit comprises a lookup table including a first portion storing a first group of addresses associated with a first data retention time, and a second portion storing a second group of addresses associated with a second data retention time different from the first data retention time, wherein the addresses of the first portion are more frequently accessed than the addresses of the second portion to refresh the memory cells corresponding to the addresses.

According to another embodiment, the lookup table further comprises a third portion storing a third group of addresses associated with a third data retention time different from the first and the second data retention time, wherein the portions of the groups are arranged according to the associated data retention times, and the addresses of the portions are accessed in order from the group of the lowest data retention time to the groups of higher data retention time to refresh the memory cells corresponding to the addresses.

In an embodiment, the addresses in the group of the lowest data retention time are accessed again as a second loop of access in a reference time from a first loop of access, and the reference time corresponds to the associated lowest data retention time.

In an embodiment, in the second loop of access, after the addresses of the group of the lowest data retention time are accessed, the next address of the last accessed address in the first loop of access is accessed.

In an embodiment, the device is a volatile memory device, a memory device or a memory system.

In an embodiment, the lookup table further comprises flag bits with which the groups are recognized In an embodiment, the lookup table further comprises a plurality of sub tables and each of the group of the addresses is stored in each of the plurality of sub tables In an embodiment, the addresses are stored in the lookup table before packaging the device.

In an embodiment, further comprises a logic circuit measuring data retention time of memory cells, wherein the addresses in the lookup table is stored after packaging the device.

In embodiments, a refresh address generator to generate refresh addresses to refresh memory cells corresponding to the generated refresh addresses, the refresh address generator comprises a lookup table comprising a first portion storing a first group of addresses associated with a first data retention time, a second portion storing a second group of addresses associated with a second data retention time longer the first data retention time, and a third portion storing a third group of addresses associated with a third data retention time longer than the second data retention time, wherein the addresses of the first portion are more frequently accessed than the addresses of the second portion and the third portion to refresh the memory cells corresponding to the addresses, and the portions of the groups are arranged according to the associated data retention times, and the addresses of the portions are accessed in order from the first group to the third group to refresh the memory cells corresponding to the addresses. A method of refreshing memory cells comprises refreshing a first group of memory cells whose addresses are stored in a lookup table, refreshing a second group of memory cells whose addresses are stored in the lookup table, wherein the first group is associated with a first data retention time and the second group is associated with a second data retention time longer than the first retention time, and a refresh address generator circuit accesses the first group of addresses in the lookup table more frequently than the second group of addresses.

In an embodiment, the method comprises refreshing one or more other groups of memory cells whose addresses are stored in the lookup table in order of the data retention times of the memory cells from the shortest to longer data retention times, stopping refreshing when a reference time lapse from the start time of refreshing operation, storing the address last refreshed in a memory, returning to the group of the shortest data retention time, and restarting the refresh operation from the group of shortest data retention time, completing the refresh operation of the group of shortest data retention time, refreshing the next memory cell of the stored memory address, wherein the reference time corresponds to the shortest data retention time.

In an embodiment, the lookup table comprises a plurality of sub tables and each group of addresses is stored in each table.

In an embodiment, the size of the sub tables are different each other.

In an embodiment, the lookup table is embedded in a memory device.

In embodiments, a refresh address generating method comprises, accessing to a first group of memory cell addresses stored in a lookup table to generate a refresh address to activate a refresh of memory cells corresponding to the generated refresh addresses, the refresh address generator circuit comprising, a lookup table comprising a first portion storing a first group of addresses associated with a first data retention time, and a second portion storing a second group of addresses associated with a second data retention time different from the first data retention time, wherein the addresses of the first portion are more frequently accessed than the addresses of the second portion to refresh the memory cells corresponding to the addresses.

In an embodiment, the lookup table further comprises a third portion storing a third group of addresses associated with a third data retention time different from the first and the second data retention time, wherein the portions of the groups are arranged according to the associated data retention times, and the addresses of the portions are accessed in order from the group of the lowest data retention time to the groups of higher data retention time to refresh the memory cells corresponding to the addresses.

In embodiments, the addresses in the group of the lowest data retention time are accessed again as a second loop of access in a reference time from a first loop of access, and the reference time corresponds to the associated lowest data retention time.

In an embodiment, in the second loop of access, after the addresses of the group of the lowest data retention time are accessed, the next address of the last accessed address in the first loop of access is accessed.

In an embodiment, the addresses are stored in the lookup table before packaging the device.

Systems implementing these embodiments and methods of operation are also disclosed.

BRIEF DESCRIPTION OF THE DRAWINGS

The above and other features and advantages of the present invention will become more apparent by describing in detail preferred embodiments thereof with reference to the attached drawings in which:

FIG. 8 is a table illustrating the performance of the refresh address generating operation using the look-up table according to embodiments of the present invention;

DETAILED DESCRIPTION OF THE EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

The use of the terms "a" and "an" and "the" and similar descriptions (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Hereinafter, a refresh address generator according to an embodiment of the present invention will now be described with reference to the accompanying drawings.

Figure 1:
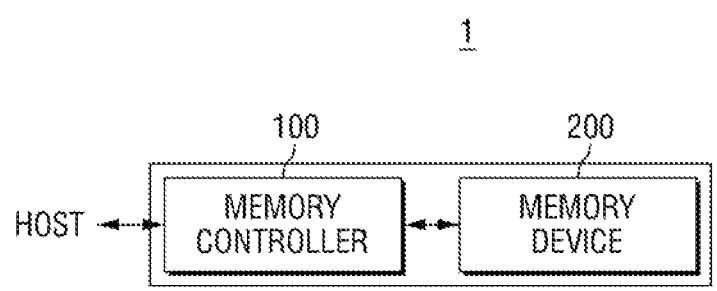
FIG. 1 is a block diagram of a memory system according to an embodiment of the present invention.

FIG. 1 is a block diagram of a memory system according to an embodiment of the present invention.

Referring to FIG. 1, the memory system 1 includes a memory controller 100 and a volatile memory device 200.

The memory controller 100 may be configured to control the volatile memory device 200. The memory controller 100 may write data to the volatile memory device 200 or may read data from the volatile memory device 200 in response to a request from a host. The memory controller 100 may drive firmware for controlling the volatile memory device 200.

In addition, the memory controller 100 may provide interface between the host and the volatile memory device 200. The memory controller 100 may include an interface protocol for exchanging data/commands between the host and the memory device 200. As an example, the memory controller 100 may be configured to communicate with an external device (host) through one of various standardized interface protocols such as Universal Serial Bus (USB), Multimedia Card (MMC), Peripheral Component Interconnection (PCI), PCI-Express (PCI-E), Advanced Technology Attachment (ATA), Parallel-ATA (PATA), Serial-ATA (SATA), Small Computer Small Interface (SCSI), Enhanced Small Disk Interface (ESDI), and Integrated Drive Electronics (IDE).

Figure 2:
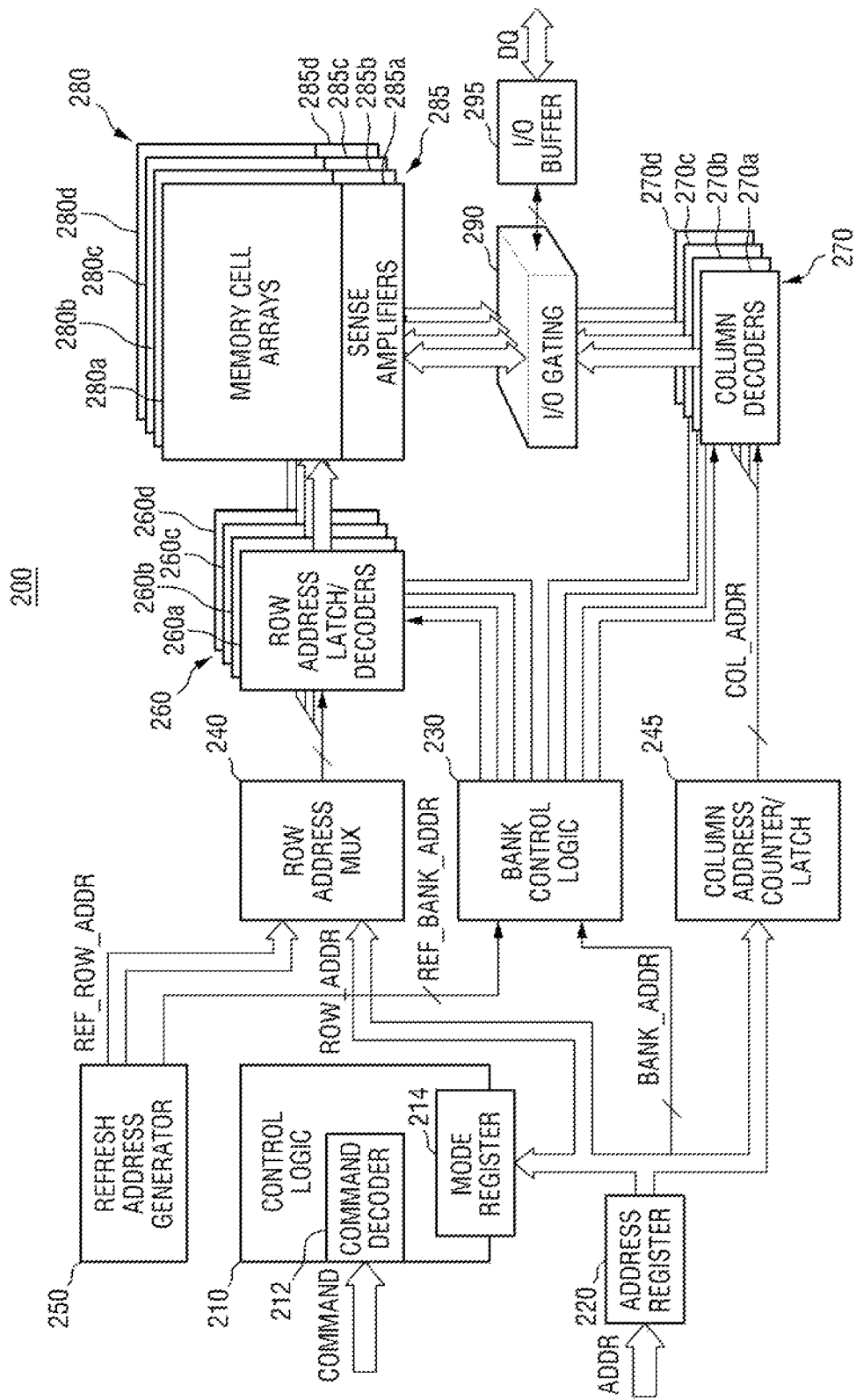
FIG. 2 is a block diagram illustrating an internal structure of a volatile memory device shown in FIG. 1.

FIG. 2 is a block diagram illustrating an internal structure of a volatile memory device shown in FIG. 1.

Referring to FIG. 2, the volatile memory device 200 may include a control logic 210, an address register 220, a bank control logic 230, a row address multiplexer (MUX) 240, a column address counter/latch 245, a refresh address generator 250, row address latch/decoders 260, column decoders 270, memory cell arrays 280, sense amplifiers 285, an I/O gating circuit 290, bank sense amplifiers 285a to 285d, and an I/O buffer 295.

The control logic 210 may control the operation of the volatile memory device 200. As an example, the control logic 210 may generate control signals to allow the volatile memory device 200 to write data or to read data. The control logic 210 may include a command decoder 212 that decodes a command CMD received from the memory controller 100, and a mode register 214 for setting an operation mode of the volatile memory device 200. As an example, the command decoder 212 may decode a write enable signal /WE, a row address strobe signal /RAS, a column address strobe signal /CAS, a chip selection signal /CS, and so on, and may generate control signals corresponding to the command CMD. The control logic 210 may also receive a clock signal CLK and a clock enable signal /CKE for driving the volatile memory device 200 in a synchronous manner.

In addition, the control logic 210 may control the refresh address generator 250 to perform an auto refresh operation in response to a refresh command REF, or may control the refresh address generator 250 to perform a self refresh operation in response to a self refresh enter command SRE.

The address register 220 may receive addresses ADDR from the memory controller 100. As an example, the address register 220 may receive a bank address signal BANK_ADDR, a row address signal ROW_ADDR, and a column address signal COL_ADDR. The address register 220 may provide the received bank address signal BANK_ADDR to the bank control logic 230, the received row address signal ROW_ADDR to the row address MUX 240, and received column address signal COL_ADDR to the column address counter/latch 245.

The bank control logic 230 may generate bank control signals in response to a bank address signal BANK_ADDR received from the address register 220 or a refresh bank address signal REF_BANK_ADDR received from the refresh address generator 250. In response to the bank control signals, bank row address latch/decoders 260a to 260d corresponding to bank addresses may be activated and bank column decoders 270a to 270d corresponding to bank addresses may be activated.

The row address MUX 240 may receive the row address signal ROW_ADDR from the address register 220 and may receive the refresh row address signal REF_ADDR from the refresh address generator 250. The row address MUX 240 may selectively output the row address signal ROW_ADDR received from the address register 220 or the refresh row address signal REF_ADDR received from the refresh address generator 250 to then provide the same to the row address latch/decoders 260.

The column address counter/latch 245 may receive the column address signal COL_ADDR from the address register 220 and may temporarily store the received column address signal COL_ADDR. The column address counter/latch 245 may provide the temporarily stored column address signal COL_ADDR to the column decoders 270.

The refresh address generator 250 may generate refresh addresses for refreshing the memory cells. The refresh addresses may include a refresh row address signal REF_ROW_ADDR and a refresh bank address signal REF_BANK_ADDR. The refresh address generator 250 may provide the refresh row address signal REF_ROW_ADDR to the row address MUX 240 and may provide the refresh bank address signal REF_BANK_ADDR to the bank control logic 230. Accordingly, the memory cells of the memory banks 280a to 280d corresponding to the refresh bank addresses and arranged on the word lines corresponding to the refresh row addresses may be refreshed.

The row address latch/decoders 260 may include first to fourth bank row address latch/decoders 260a to 260d connected to first to fourth memory banks 280a to 280d, respectively, and the column decoders 270 may include first to fourth bank column decoders 270a to 270d connected to first to fourth memory banks 280a to 280d, respectively.

The bank row address latch/decoders 260a to 260d activated by the bank control logic 230 decode the received row address signal ROW_ADDR or REF_ADDR to then activate word lines corresponding to the row addresses. As an example, the bank row address latch/decoders 260a to 260d may apply word line driving voltages to the word line corresponding to the row addresses.

The bank column decoders 270a to 270d activated by the bank control logic 230 may activate the bank sense amplifiers 285a to 285d according to the bank addresses and the column addresses through the I/O gating circuit 290.

The memory cell arrays 280 may include a plurality of memory cells for storing data. The plurality of memory cells may constitute the first to fourth memory banks 280a to 280d. The volatile memory device including four memory banks is exemplified in FIG. 2, but aspects of the present invention are not limited thereto. The volatile memory device 200 may include an arbitrary number of memory banks.

The sense amplifiers 285 may include first to fourth bank sense amplifiers 285a to 285d connected to the first to fourth memory banks 280a to 280d, respectively.

The I/O gating circuit 290 may include an input data mask logic, read data latches for storing the data read from the first to fourth memory banks 280a to 280d, and write drivers for writing data in the first to fourth memory banks 280a to 280d with circuits for gating input/output data.

The data DQ to be written in the first to fourth memory banks 280a to 280d may be provided from the memory controller 100 to the I/O buffer 295. The data DQ provided to the I/O buffer 295 may be written in the memory banks through the write drivers.

The data DQ read from the first to fourth memory banks 280a to 280d may be sensed by the bank sense amplifiers 285a to 285d corresponding to the memory banks and may be stored in the read data latches. The data DQ stored in the read data latches may be provided to the memory controller 100 through the I/O buffer 295.

In the embodiment of the present invention, the volatile memory device 200 may be a dynamic random access memory (DRAM), such as a double data rate synchronous dynamic random access memory (DDR SDRAM), a low power double data rate (LPDDR) SDRAM, a graphics double data rate (GDDR) SDRAM, or a rambus dynamic random access memory (RDRAM), or an arbitrary volatile memory device requiring a refresh operation.

Figure 3:
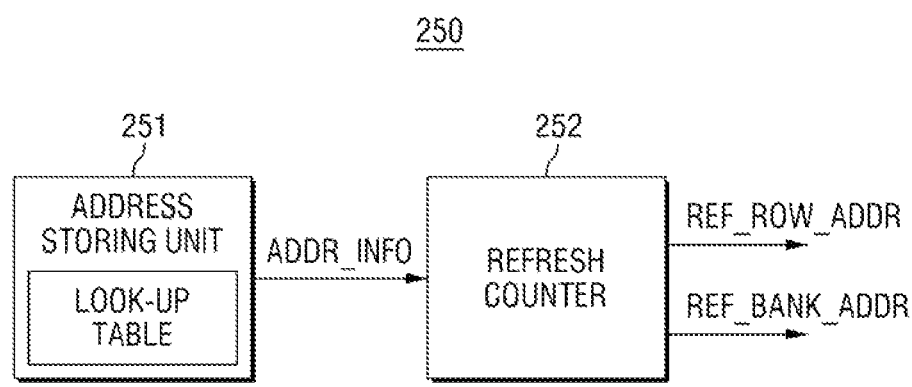
FIG. 3 is a block diagram illustrating an internal structure of a refresh address generator shown in FIG. 2.

FIG. 3 is a block diagram illustrating an internal structure of a refresh address generator shown in FIG. 2.

Referring to FIG. 3, a refresh address generator 250 may include an address storing unit 251 and a refresh counter 252.

The address storing unit 251 may store addresses of weak cell rows. The addresses of weak cell rows constitute a lookup table to be stored in the address storing unit 251. The weak cells may be memory cells having retention time durations shorter than the refresh time of the volatile memory device 200. The refresh time may mean a time period required for a memory cell to be refreshed again. The weak cell rows may represent word lines in which one or more weak cells are arranged. The address storing unit 251 may provide address information ADDR_INFO of the weak cell rows to the refresh counter 252.

The addresses of weak cell rows may include bank addresses of memory banks 280a to 280d including the weak cells and row addresses of word lines in which the weak cells are arranged. The addresses of weak cell rows may be stored in the address storing unit 251 before packaging the volatile memory device 200 or may be stored in the address storing unit 251 after packaging the volatile memory device 200. The address storing unit 251 may include a variety of nonvolatile memory devices, such as an electrically programmable fuse memory, a laser-programmable fuse memory, an anti-fuse memory, a one-time programmable memory, or a flash memory.

The refresh counter 252 may generate refresh addresses. The refresh counter 252 may sequentially output the addresses of all of the memory cell rows as the refresh addresses. All of the memory cell rows may include all word lines of the volatile memory device 200. In this case, the refresh counter 252 performs a counting operation to increase the refresh address sequentially. In addition, the refresh counter 252 may output the addresses of weak cell rows as the refresh addresses. In this case, the refresh counter 252 may generate the refresh addresses using the address information received from the address storing unit 251.

Figure 4:
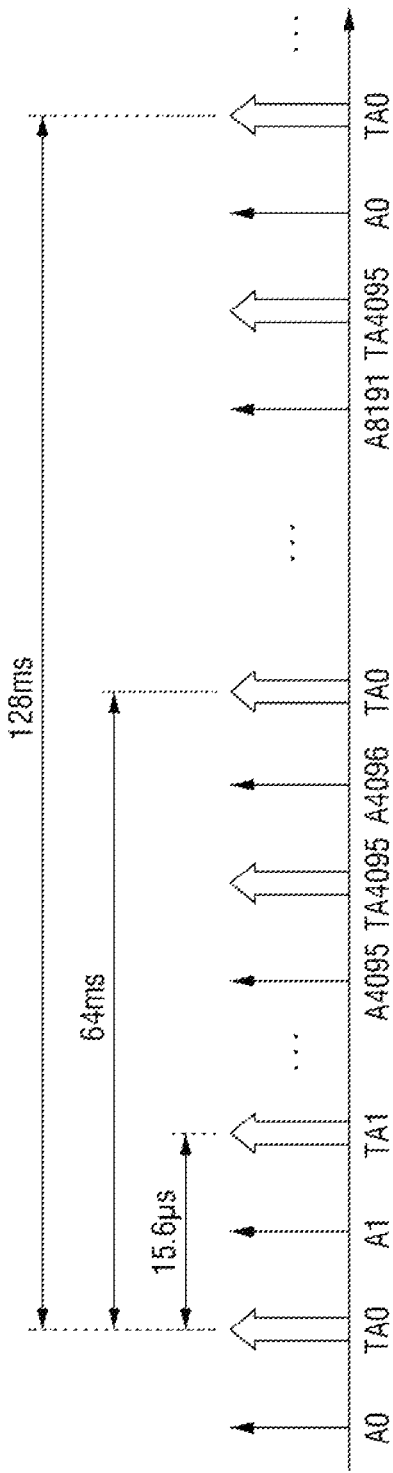
FIG. 4 is a timing diagram illustrating a refresh operation of a volatile memory device of an embodiment of the present invention.

FIG. 4 is a timing diagram illustrating a refresh operation of a volatile memory device of an embodiment of the present invention.

Referring to FIG. 4, once a refresh operation is started, all of the word lines of the volatile memory device 200 may be refreshed at a refresh cycle. As an example, the refresh cycle may be 15.6 μs, but not limited thereto. The refresh cycle may vary according to the specification of the volatile memory device 200. Reference symbols A0 to A8191 indicate 8K word lines of the volatile memory device 200.

Meanwhile, since weak cell rows have short retention time durations, they should be refreshed more frequently than normal word lines. The refresh operations of the weak cell rows and ordinary refresh operations may be alternately performed. As an example, when the volatile memory device 200 is capable of refreshing 8K word lines during a refresh time duration of 64 ms, all of the word lines of the volatile memory device 200 may be refreshed once every refresh cycle during a refresh time duration of 128 ms as an ordinary refresh operation. Alternately, the refresh operations of the weak cell rows may be performed between the ordinary refresh operations. Reference symbols TA0 to TA4095 indicate 4K weak cell rows stored in the look-up table. Such refresh operations may be referred to as "refresh leveraging."

In the conventional refresh operation, weak cell rows needed to be refreshed more often are arranged more often in the look-up table so as to be refreshed more frequently. Therefore, as the number of weak cell rows (especially the ones to be refreshed more frequently) increases, the size of the look-up table increases. Accordingly the chip size of the volatile memory device increases. Hereinafter, a method for minimizing the size of the look-up table will be described as an embodiment of the present invention.

Figure 5:
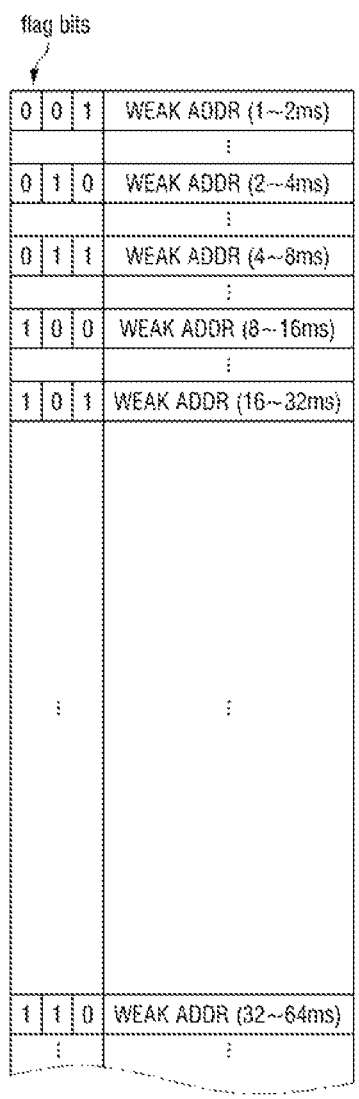
FIG. 5 is a diagram illustrating a structure of a look-up table according to an embodiment of the present invention.

FIG. 5 is a diagram illustrating a structure of a look-up table according to an embodiment of the present invention.

Referring to FIG. 5, the addresses of the weak cell rows may be sequentially arranged from a start address of the look-up table according to retention time durations. The addresses of the weak cell rows may be divided into a plurality of groups according to retention time durations. As an example, the addresses of the weak cell rows may be divided into a first group having a retention time duration from 1 ms to 2 ms, a second group having a retention time duration from 2 ms to 4 ms, a third group having a retention time duration from 4 ms to 8 ms, a fourth group having a retention time duration from 8 ms to 16 ms, a fifth group having a retention time duration from 16 ms to 32 ms, a sixth group having a retention time duration from 32 ms to 64 ms, and a seventh group having a retention time duration from 64 ms to 128 ms.

The look-up table may further include flag bits corresponding to the retention time durations of the weak cell rows. As an example, since the addresses of the weak cell rows are divided into 7 groups, the flag bits may include 3 bits.

Figure 6:
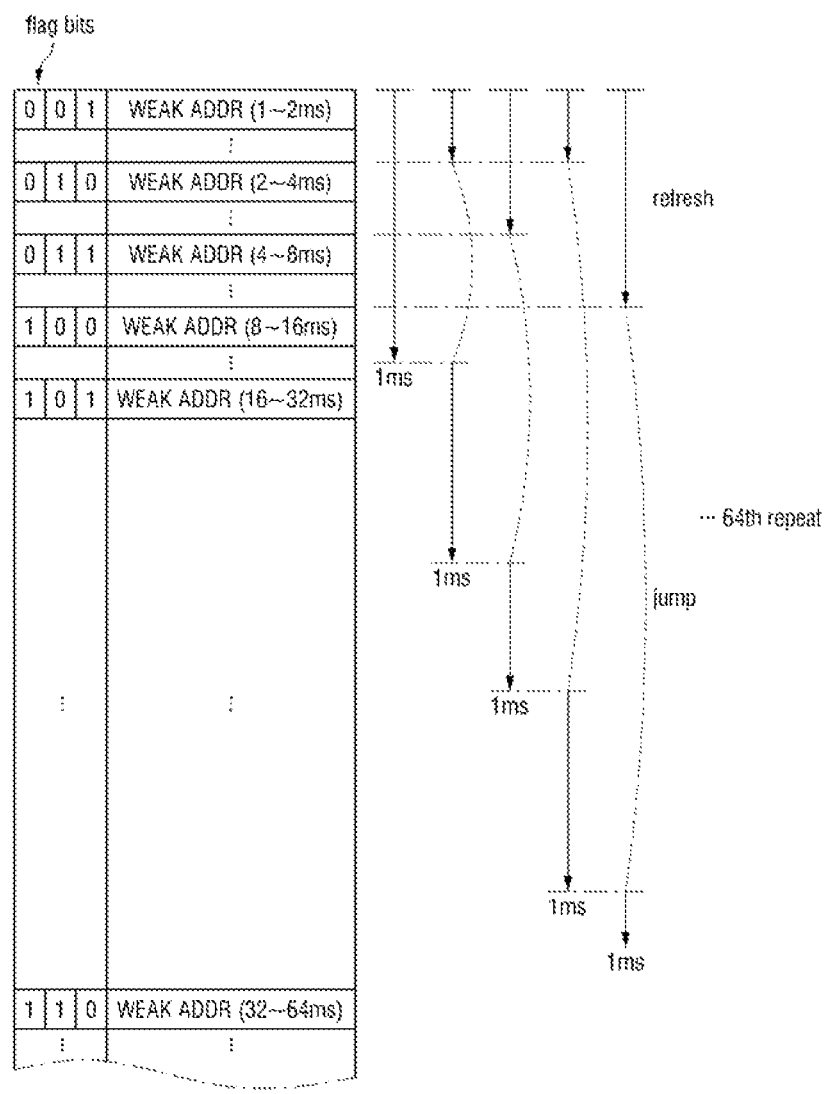
FIG. 6 is a diagram illustrating a refresh address generating operation using the look-up table shown in FIG. 5.

FIG. 6 is a diagram illustrating a refresh address generating operation using the look-up table shown in FIG. 5.

Referring to FIG. 6, the refresh counter 252 may sequentially output the addresses of weak cells from a start address of the look-up table during a reference time. The operation of the refresh counter 252 may include loop operations. That is to say, the refresh counter 252 may complete refresh operations of the weak cell rows by repeating the loop operation for each reference time. The reference time may correspond to the shortest one of retention time durations of the weak cell rows. Accordingly, in the embodiments of FIG. 5 and FIG. 6, the reference time may be 1 ms, and the refresh counter 252 may repeat 64 times of the loop operations during the refresh time.

While performing the loop operations, the refresh counter 252 may re-output the addresses of weak cells belonging to the nth group at a time interval of n, where n is a natural number greater than or equal to 1, while repeatedly performing the loop operations for each reference time. The refresh counter 252 may not re-output addresses of the weak cell rows previously output when the addresses of weak cell rows belonging to the first to nth groups are re-output in the present loop operation.

As an example, the weak cell rows of the first group may be re-output at a time interval of 1 ms, the weak cell rows of the second group may be re-output at a time interval of 2 ms, and the weak cell rows of the third group may be re-output at a time interval of 4 ms. The weak cell rows of the other groups may also be re-output similar to the above-stated weak cell rows.

As shown in FIG. 6, in the first loop operation, the refresh counter 252 may sequentially output addresses of weak cells from a start address of the look-up table. After the lapse of the reference time of 1 ms, the refresh counter 252 may temporarily store the last output address of the look-up table.

In the second loop operation, the refresh counter 252 may sequentially re-output addresses of weak cells from the start address of the look-up table. Here, the refresh counter 252 re-outputs the addresses of weak cells needed to be refreshed while not re-outputting the addresses of weak cells needed not to be refreshed. That is to say, since the weak cell rows of the first group need to be refreshed at a time interval of 1 ms, the refresh counter 252 outputs the addresses of the first group, while not re-outputting the addresses of weak cells of the other groups outputted in the first loop operation. The refresh counter 252 may move on to an address next to the temporarily stored address in the first loop operation and may sequentially output yet-to-be-output addresses of weak cell rows.

Likewise, in the third loop operation, the refresh counter 252 may sequentially output addresses of weak cells from the start address of the look-up table. Here, since the weak cell rows of the second group need to be refreshed at a time interval of 2 ms, the refresh counter 252 re-outputs the addresses of weak cells belonging to the first and second groups, while not re-outputting the addresses of weak cells belonging to the other groups outputted in the first and second loop operations. The refresh counter 252 may move on to an address next to the temporarily stored address in the second loop operation and may sequentially output yet-to-be-output addresses of weak cell rows.

In the fourth loop operation, the refresh counter 252 may sequentially re-output addresses of weak cells from the start address of the look-up table. Like in the second loop operation, the refresh counter 252 re-outputs the addresses of weak cells of the first group while not re-outputting the addresses of weak cells of the other groups outputted in the first, second and third loop operations. The refresh counter 252 may move on to an address next to the temporarily stored address in the third loop operation and may sequentially output yet-to-be-output addresses of weak cell rows.

Likewise, in the fifth loop operation, the refresh counter 252 may sequentially output addresses of weak cells from the start address of the look-up table. Here, since the weak cell rows of the second group need to be refreshed at a refresh time interval of 2 ms and the weak cell rows of the third group need to be refreshed at a refresh time interval of 4 ms, the refresh counter 252 outputs the addresses of the first to third groups while not re-outputting the addresses from fifth group to the address temporarily stored in the fourth loop operation. Then, the refresh counter 252 may move on to an address next to the temporarily stored address in the fourth loop operation and may sequentially output yet-to-be-output addresses of weak cell rows.

Similarly, the refresh counter 252 may output addresses of weak cell rows in subsequent loop operations. The refresh counter 252 divides the groups of weak cell rows according to flag bits of the look-up table to determine whether the weak cells need to be refreshed.

Accordingly, the weak cell rows needed to be refreshed frequently need not to be repeatedly arranged in the look-up table and the refresh counter 252 may use flag bits in the loop operations, which may minimize the size of the look-up table.

Figure 7:
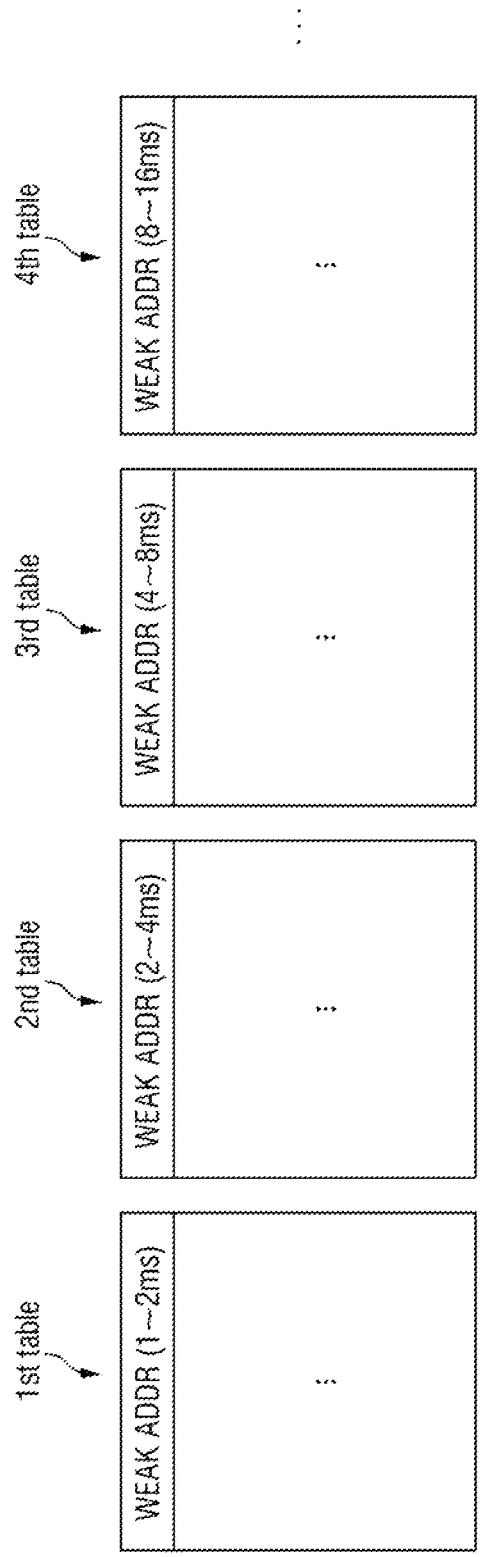
FIG. 7 is a diagram illustrating a structure of a look-up table according to another embodiment of the present invention.

FIG. 7 is a diagram illustrating a structure of a look-up table according to another embodiment of the present invention.

Referring to FIG. 7, the look-up table may include a plurality of sub tables corresponding to retention time durations of weak cells. In each sub table, addresses of weak cell rows having the respective retention time durations may be sequentially arranged. That is to say, the plurality of groups for the addresses of weak cell rows described above with reference to FIG. 5 may be arranged in the plurality of sub tables. The plurality of sub tables may have the same size or different sizes. As an example, the sizes of the sub tables may be increased by two times according to the retention time duration.

The refresh counter 252 may sequentially output addresses of weak cell rows from a start address of the first sub table during a reference time. While performing the above-described loop operations, the refresh counter 252 may re-output addresses of weak cell rows of the nth sub table at a time interval of n. The refresh counter 252 may not re-output addresses of the weak cell rows previously output when the addresses of weak cell rows of the first to nth sub tables are re-output in the current loop operation.

The refresh counter 252 recognizes the sub tables to identify groups of weak cell rows, thereby determining whether to refresh the weak cell rows according to retention time durations. The sub tables may be categorized by address ranges or last addresses of the groups of the week cell rows.

Because the weak cell rows needed to be refreshed frequently are not repeatedly arranged in the look-up table and the refresh counter 252 enables a loop operation with the sub tables, the size of the look-up table may be minimized.

FIG. 8 is a table illustrating the performance of the refresh address generating operation using the look-up table according to embodiments of the present invention.

As an example, if 4K weak cell rows are stored in the look-up table, the number of weak cell rows of the first group having a retention time duration from 1 ms to 2 ms is A or less, the number of weak cell rows of the second group having a retention time duration from 2 ms to 4 ms is B or less, the number of weak cell rows of the third group having a retention time duration from 4 ms to 8 ms is C or less, the number of weak cell rows of the fourth group having a retention time duration from 8 ms to 16 ms is D or less, the number of weak cell rows of the fifth group having a retention time duration from 16 ms to 32 ms is E or less, the number of weak cell rows of the sixth group having a retention time duration from 32 ms to 64 ms is F or less, and the number of weak cell rows of the seventh group having a retention time duration from 64 ms to 128 ms is G or less. Here, A, B, C, D, E, F and G may be 64, 128, 256, 512, 1024, 2048, and 4096, respectively. It is assumed that the volatile memory device 200 is capable of 8K word lines for a refresh time of 64 ms.

If the above-stated conditions are satisfied, the size of the look-up table can be reduced by 23% to 50%, compared to the size of the conventional look-up table.

Figure 9:
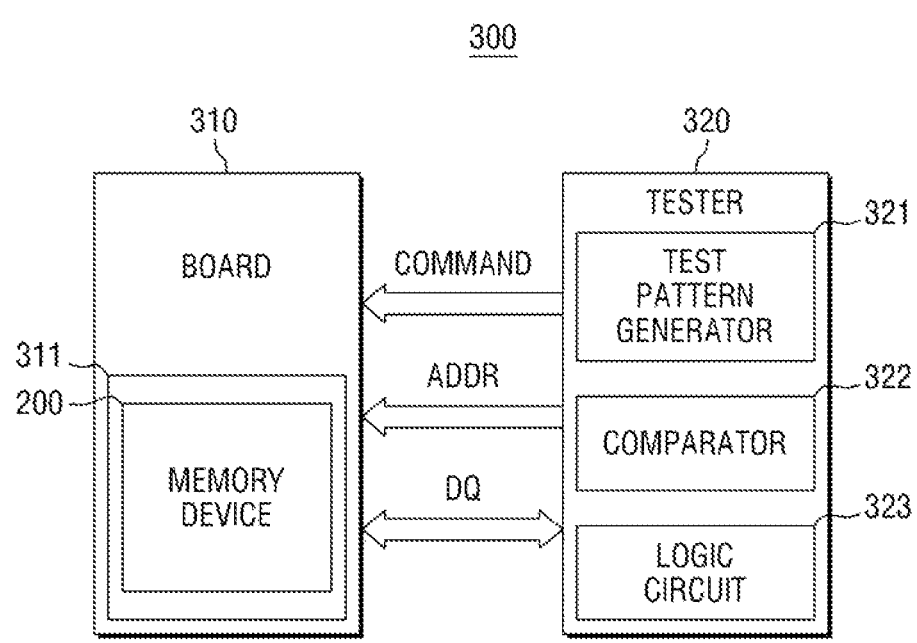
FIG. 9 is a block diagram of a test system of a volatile memory device according to an embodiment of the present invention.

FIG. 9 is a block diagram of a test system of a volatile memory device according to an embodiment of the present invention.

Referring to FIG. 9, the test system 300 includes a test board 310 and a tester 320.

The test board 310 may include a socket 311 on which the volatile memory device 200 is mounted. The test board 310 may provide commands, addresses and data transmitted from the tester 320 to the volatile memory device 200.

The tester 320 may include a test pattern generator 321 generating test patterns, a comparator 322 comparing data output from the volatile memory device 200, and a logic circuit 323 determining whether the volatile memory device 200 passes or failed. The tester 320 generates test patterns in an arbitrary manner to search for weak cells of the volatile memory device 200. Among the weak cells, the weak cells having retention time durations shorter than 1 ms can be recovered using redundancy cells. Information about addresses of the other weak cells may be stored in the look-up table before packing the volatile memory device 200.

Meanwhile, the volatile memory device 200 may further incorporate a logic circuit for searching for weak cells. In this case, the address information about weak cells may be stored in the look-up table after packing the volatile memory device 200 even without using the test system.

Figure 10:
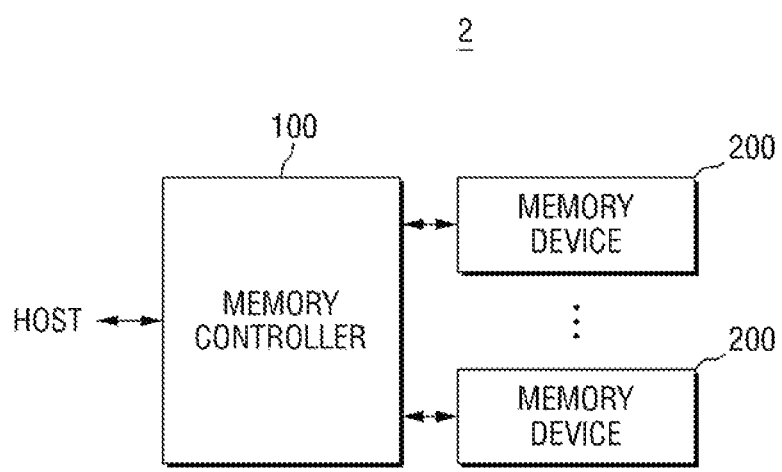
FIG. 10 is a block diagram illustrating an application example of a memory system according to an embodiment of the present invention.

FIG. 10 is a block diagram illustrating an application example of a memory system according to an embodiment of the present invention.

Referring to FIG. 10, the memory system 2 may include a memory controller 100 and a plurality of volatile memory devices 200.

The plurality of volatile memory devices 200 may be configured in substantially the same manner as the volatile memory device 200 shown in FIG. 1. Since weak cell rows needed to be refreshed often are not repeatedly arranged in the look-up tables of the volatile memory devices 200, the sizes of the look-up tables can be minimized.

The plurality of volatile memory devices 200 may be connected to the memory controller 100 through channels. In FIG. 10, one volatile memory devices 200 is connected to one channel. In a modified embodiment of the present invention, however, a plurality of volatile memory devices 200 may be connected to one channel.

Figure 11:
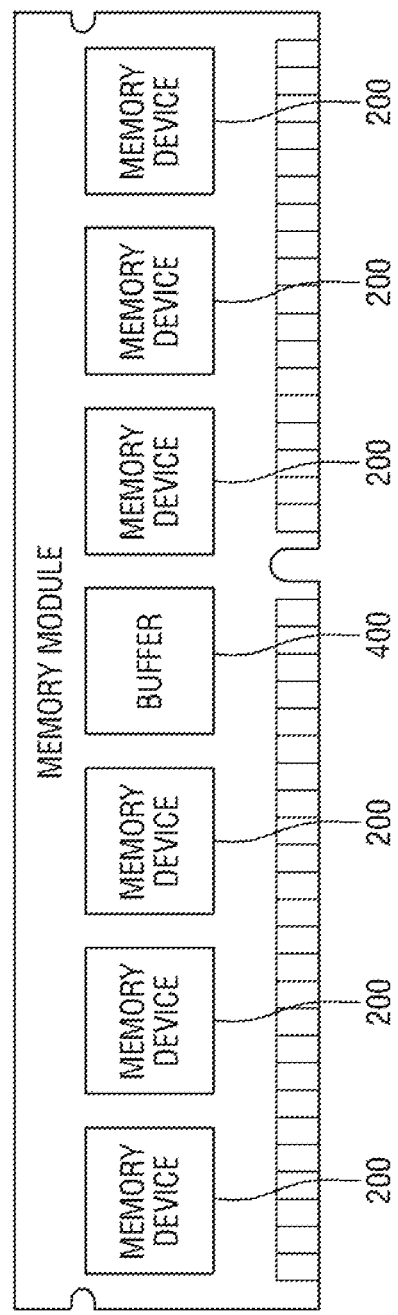
FIG. 11 is a diagram illustrating a memory module including a memory system according to an embodiment of the present invention.

FIG. 11 is a diagram illustrating a memory module including a memory system according to an embodiment of the present invention.

Referring to FIG. 11, the memory module 3 may include a plurality of volatile memory devices 200.

The memory module 3 may further include a buffer 400 receiving commands, addresses and data from a memory controller and buffering the received commands, addresses and data to provide the same to the volatile memory devices 200.

Data transmission lines between the buffer 400 and the volatile memory devices 200 may be connected in a point-to-point manner. In addition, command/address transmission lines between the buffer 400 and the volatile memory devices 200 may be connected in a multi-drop manner, a daisy-chain manner or a fly-by-daisy-chain manner.

Since the buffer 400 buffers all of the commands, addresses and data, the memory controller drives only a load of the buffer 400, thereby interfacing with the memory module 3.

The plurality of volatile memory devices 200 may be configured in substantially the same manner as the volatile memory device 200 shown in FIG. 1. Since weak cell rows needed to be refreshed often are not repeatedly arranged in look-up tables of the volatile memory devices 200, the sizes of the look-up tables can be minimized.

The memory module 3 may be an arbitrary memory module, such as an unbuffered dual in-line memory module (UDIMM), a registered dual in-line memory module (DIMM), a fully buffered dual in-line memory module (FB-DIMM), or a load reduced dual in-line memory module (LRDIMM).

Figure 12:
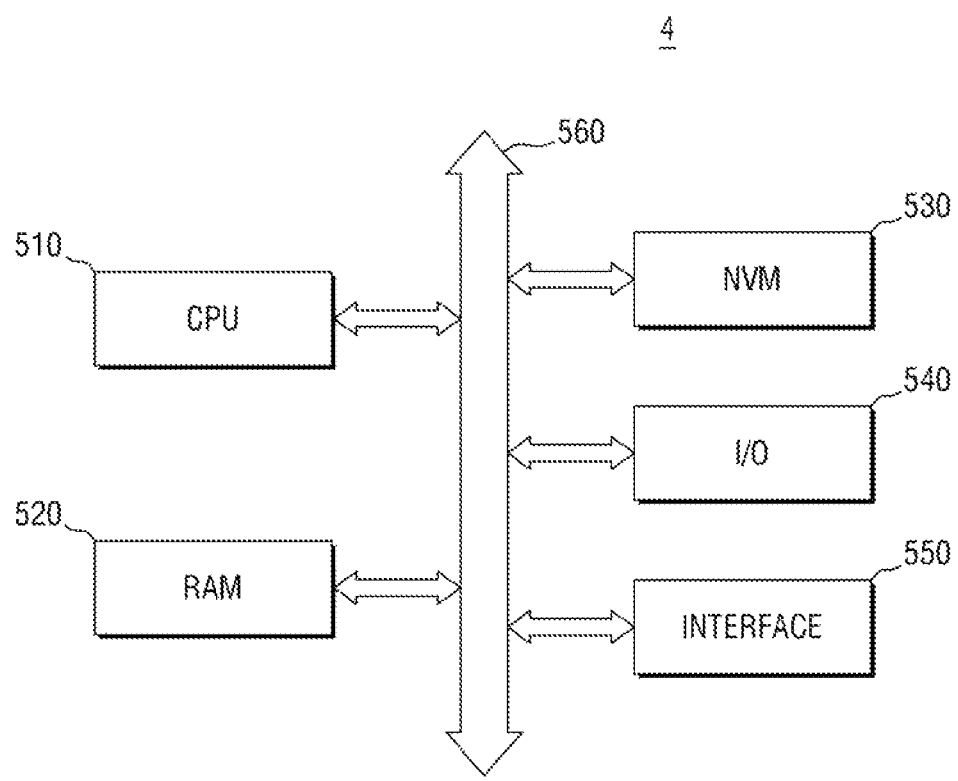
FIG. 12 is a diagram illustrating a computing system including a memory system according to an embodiment of the present invention.

FIG. 12 is a diagram illustrating a computing system including a memory system according to an embodiment of the present invention.

Referring to FIG. 12, the computing system 4 may include a central processing unit (CPU) 510, a random access memory (RAM) 520 as a main memory device, nonvolatile memory device (NVM) 530, an input/output device (I/O) 540, and an interface 550.

The CPU 510, the RAM 520, the NVM 530, the I/O 540 and the interface 550 may be connected to each other through a bus 560. The bus 560 may correspond to a path along which data moves.

The CPU 510 may include a single core or a multi-core having multiple processor cores to process data. As an example, the CPU 510 may include a multi-core, such as a dual-core, a quad-core, a hexa-core, or the like. In addition, the CPU 510 may further include a cache memory positioned inside or outside the CPU 510.

The RAM 520 may store data processed by the CPU 510 or may operate as a working memory of the CPU 510. As an example, the RAM 520 may be a dynamic random access memory (DRAM), such as DDR SDRAM, LPDDR SDRAM, GDDR SDRAM, or RDRAM, or an arbitrary volatile memory device needed to be refreshed.

The RAM 520 may be configured in substantially the same manner as the volatile memory device 200 shown in FIG. 1. Since weak cell rows needed to be refreshed often are not repeatedly arranged in the look-up tables of the RAM 520, the sizes of the look-up tables can be minimized.

The nonvolatile memory device (NVM) 530 may store a boot image for booting the computing system 4. As an example, the NVM 530 may be one of a variety of nonvolatile memory devices, such as an electrically erasable programmable read-only memory (EEPROM), a flash memory, a phase change random access memory (RAM), a resistance random access memory (RRAM), a nano floating gate memory (NFGM), a polymer random access memory (PoRAM), a magnetic random access memory (MRAM), or a ferroelectric random access memory (FRAM).

The I/O 540 may include one or more input devices, such as a keypad or a touch screen, and/or one or more output devices, such as a speakerphone, or a display.

The interface 550 may perform wireless or wired communication with an external device. For example, the interface 550 may perform Ethernet communication, near field communication (NFC), radio frequency identification (RFID) communication, mobile telecommunication, memory card communication, or universal serial bus (USB) communication.

According to embodiments, the computing system 4 may further include a camera image processor (CIS) and a storage device, such as a memory card, a solid state drive (SSD), a hard disk drive (HDD), a CD-ROM).

In the embodiment of the present invention, the computing system 4 may be an arbitrary computing system, such as a mobile phone, a smart phone, a personal digital assistant (PDA), a portable multimedia player (PMP), a digital camera, a music player, a portable game console, a navigation system, or the like.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A device comprising:
    a refresh address generator circuit to generate refresh addresses to activate a refresh of memory cells corresponding to the generated refresh addresses, the refresh address generator circuit comprising:
    a lookup table comprising a first portion storing a first group of addresses associated with a first data retention time, and a second portion storing a second group of addresses associated with a second data retention time different from the first data retention time,
    wherein the refresh address generator is configured to access the addresses stored in the first portion more frequently than the addresses stored in the second portion to refresh the memory cells corresponding to the addresses.

2. The device of claim 1, wherein the lookup table further comprises:
    a third portion storing a third group of addresses associated with a third data retention time different from the first and the second data retention time,
    wherein the portions of the groups are arranged according to the associated data retention times, and
    the refresh address generator is configured to access the addresses of the portions in order from the group associated with the lowest data retention time to the groups associated with the higher data retention time to refresh the memory cells corresponding to the addresses.

3. The device of claim 2, wherein the refresh address generator is configured to access addresses in the group associated with the lowest data retention time again during a second loop of access within a reference time from a first loop of access, wherein the reference time corresponds to the lowest data retention time.

4. The device of claim 3, wherein during the second loop of access, after the addresses of the group of the lowest data retention time are accessed, the next address of the last accessed address during the first loop of access is accessed.

5. The device of claim 1, wherein the device is a volatile memory device, a memory device or a memory system.

6. The device of claim 1, wherein the lookup table further comprises flag bits, wherein the refresh address generator references the flag bits to associate an entry of the look-up table with a group.

7. The device of claim 1, wherein the lookup table further comprises a plurality of sub tables and wherein each group of the addresses is stored in a corresponding one of the plurality of sub tables.

8. The device of claim 1, wherein the lookup table is configured to store the addresses before packaging the device.

9. The device of claim 1, further comprising a logic circuit configured to measure data retention time of memory cells,
wherein the lookup table is configured to store the addresses after packaging the device.

10. A memory device comprising:
a refresh address generator configured to generate refresh addresses to activate a refresh of memory cells corresponding to the generated refresh addresses, the refresh address generator comprising:
a lookup table comprising:
a first portion storing a first group of addresses associated with a first data retention time,
a second portion storing a second group of addresses associated with a second data retention time longer than the first data retention time, and
a third portion storing a third group of addresses associated with a third data retention time longer than the second data retention time,
wherein the addresses stored in the first portion are more frequently accessed than the addresses stored in the second portion and the third portion to refresh the memory cells corresponding to the addresses stored in the first portion more frequently than a refresh of memory cells corresponding to addresses stored in the second portion and the third portion.

11. The memory device of claim 10, wherein the refresh address generator is configured to access the lookup table at regular intervals, wherein the first portion of the lookup table is accessed at each of the regular intervals to refresh memory cells corresponding to the first group of addresses at each of the regular intervals.

12. The memory device of claim 10, wherein the refresh address generator is configured to access the lookup table at regular intervals, wherein the refresh address generator is configured to access the lookup table at a location immediately subsequent to the last access of the lookup table during the subsequent period.

13. The memory device of claim 10, wherein the first, second and third portions are arranged in an order in the lookup table according to the associated data retention times of the addresses stored therein.

14. A method of refreshing memory cells in a device comprising:
accessing a first group of memory cell addresses stored in a first portion of a lookup table to cause a refresh of a first group of memory cells corresponding to the first group of memory cell addresses; and
accessing a second group of memory cell addresses stored in a second portion of the lookup table to cause a refresh of a second group of memory cells corresponding to the second group of memory cell addresses,
wherein the first group of memory cell addresses are associated with a first data retention time and the second group of memory cell addresses are associated with a second data retention time longer than the first retention time, and
the first portion of the lookup table is accessed more frequently than the second portion of the lookup table in order to cause a refresh of the first group of memory cells more frequently than the second group of memory cells.

15. The method of claim 14 wherein the first group of memory cells are identified as memory cells having the shortest retention time by the lookup table and the method further comprises:
performing a first refresh operation including
performing a series of accesses of the lookup table to retrieve memory cell addresses and cause refresh of memory cells associated with the retrieved memory cell addresses, including retrieval of the first memory cell addresses and causing refresh of the first memory cells,
stopping the series of accesses of the lookup table of the first refresh operation when a reference time lapses from the start time of the first refresh operation,
storing the address corresponding to last retrieved memory cell address of the first refresh operation,
performing a second refresh operation including,
performing a series of accesses of the lookup table to retrieve memory cell addresses and cause refresh of memory cells associated with the retrieved memory cell addresses, including retrieval of the first memory cell addresses and causing refresh of the first memory cells, and retrieval of a memory cell address determined by the address stored during the first refresh operation and causing refresh of at least one associated memory cell,
stopping the series of accesses of the lookup table of the second refresh operation when the reference time lapses from the start time of the second refresh operation, and
storing the address corresponding to the last retrieved memory cell address of the second refresh operation.

16. The method of claim 15, wherein the lookup table comprises a plurality of sub tables and each group of addresses is stored in one of the sub tables.

17. The method of claim 16, wherein the size of the sub tables are different from each other.

18. The method of claim 15, wherein the lookup table is embedded in a memory device.

19. A refresh address generating method comprising:
accessing a first group of memory cell addresses stored in a lookup table to generate a refresh address to activate a refresh of memory cells corresponding to the generated refresh addresses, the refresh address generator circuit comprising;
a lookup table comprising a first portion storing a first group of addresses associated with a first data retention time, and a second portion storing a second group of addresses associated with a second data retention time different from the first data retention time,
wherein the addresses of the first portion are more frequently accessed than the addresses of the second portion to refresh the memory cells corresponding to the addresses.

20. The method of claim 19, wherein the lookup table further comprises:
a third portion storing a third group of addresses associated with a third data retention time different from the first and the second data retention time,
wherein the portions of the groups are arranged according to the associated data retention times, and the addresses of the portions are accessed in order from the group of the lowest data retention time to the groups of higher data retention time to refresh the memory cells corresponding to the addresses.

21. The method of claim 20, wherein the addresses in the group of the lowest data retention time are accessed again in a second loop of access in a reference time from the time accessed in a first loop of access, and the reference time corresponds to the associated lowest data retention time.

22. The method of claim 21, wherein in the second loop of access, after the addresses of the group of the lowest data retention time are accessed, the access sequence jumps to the next address of the last accessed address in the first loop of access.

23. The method of claim 20, wherein the addresses are stored in the lookup table before packaging the device comprising the lookup table.

* * * * *